US 9,897,652 B2

(12) United States Patent
    LaVine

(10) Patent No.: US 9,897,652 B2
(45) Date of Patent: Feb. 20, 2018

(54) LOGIC ANALYZER

(71) Applicant: ARM LIMITED, Cambridge (GB)

(72) Inventor: Mark Gerald LaVine, Austin, TX (US)

(73) Assignee: ARM Limited, Cambridge (GB)

( * ) Notice: Subject to any disclaimer, the term of this patent is extended or adjusted under 35 U.S.C. 154(b) by 136 days.

(21) Appl. No.: 14/680,425

(22) Filed: Apr. 7, 2015

(65) Prior Publication Data

US 2015/0355275 A1    Dec. 10, 2015

(30) Foreign Application Priority Data

Jun. 5, 2014  (GB) .................................. 1409965.9

(51) Int. Cl.
    *G06F 11/00*  (2006.01)
    *G01R 31/3177*  (2006.01)

(52) U.S. Cl.
    CPC ................ *G01R 31/3177* (2013.01)

(58) Field of Classification Search
    USPC ........................................... 714/39
    See application file for complete search history.

(56) References Cited

U.S. PATENT DOCUMENTS

| | | | | |
|---|---|---|---|---|
| 4,373,193 A * | 2/1983 | Haag | ...................... | G06F 11/25 345/629 |
| 4,445,192 A * | 4/1984 | Haag | ...................... | G06F 11/34 345/418 |
| 4,480,317 A * | 10/1984 | Haag | ...................... | G06F 11/34 345/440 |
| 4,495,599 A * | 1/1985 | Haag | .................... | G06F 11/2205 345/440 |
| 5,867,644 A * | 2/1999 | Ranson | ............... | G06F 11/3648 714/39 |
| 6,389,558 B1 | 5/2002 | Herrmann et al. | | |
| 6,564,347 B1 * | 5/2003 | Mates | ................ | G01R 31/3177 714/724 |
| 6,615,369 B1 * | 9/2003 | Beck | .................. | G01R 13/0254 714/39 |
| 6,633,838 B1 * | 10/2003 | Arimilli | .............. | G06F 11/2236 703/16 |
| 7,332,929 B1 * | 2/2008 | Normoyle | .......... | G01R 31/3177 326/16 |
| 7,350,121 B2 * | 3/2008 | Creigh | ............... | G01R 31/3177 714/724 |
| 7,944,234 B2 * | 5/2011 | Lunzer | ............. | G01R 31/31928 326/38 |

(Continued)

OTHER PUBLICATIONS

UK Search Report for GB Application 1409965.9, dated Dec. 5, 2014, 3 pages.

(Continued)

*Primary Examiner* — Amine Riad
(74) *Attorney, Agent, or Firm* — Nixon & Vanderhye P.C.

(57) ABSTRACT

A logic analyzer 6 is provided with a state controller 12 and analyzer circuitry. The logic analyzer switches between a programmable sequence of trigger states and generates an index signal within each trigger state. The index signal is used to control the analyzer circuitry to select appropriate portions of programmable trigger state data so as to configure the matching operation performed against hardware signal values taken from hardware circuitry 4 which is subject to analysis by the logic analyzer 6.

17 Claims, 4 Drawing Sheets

(56) References Cited

U.S. PATENT DOCUMENTS

Figure 1:
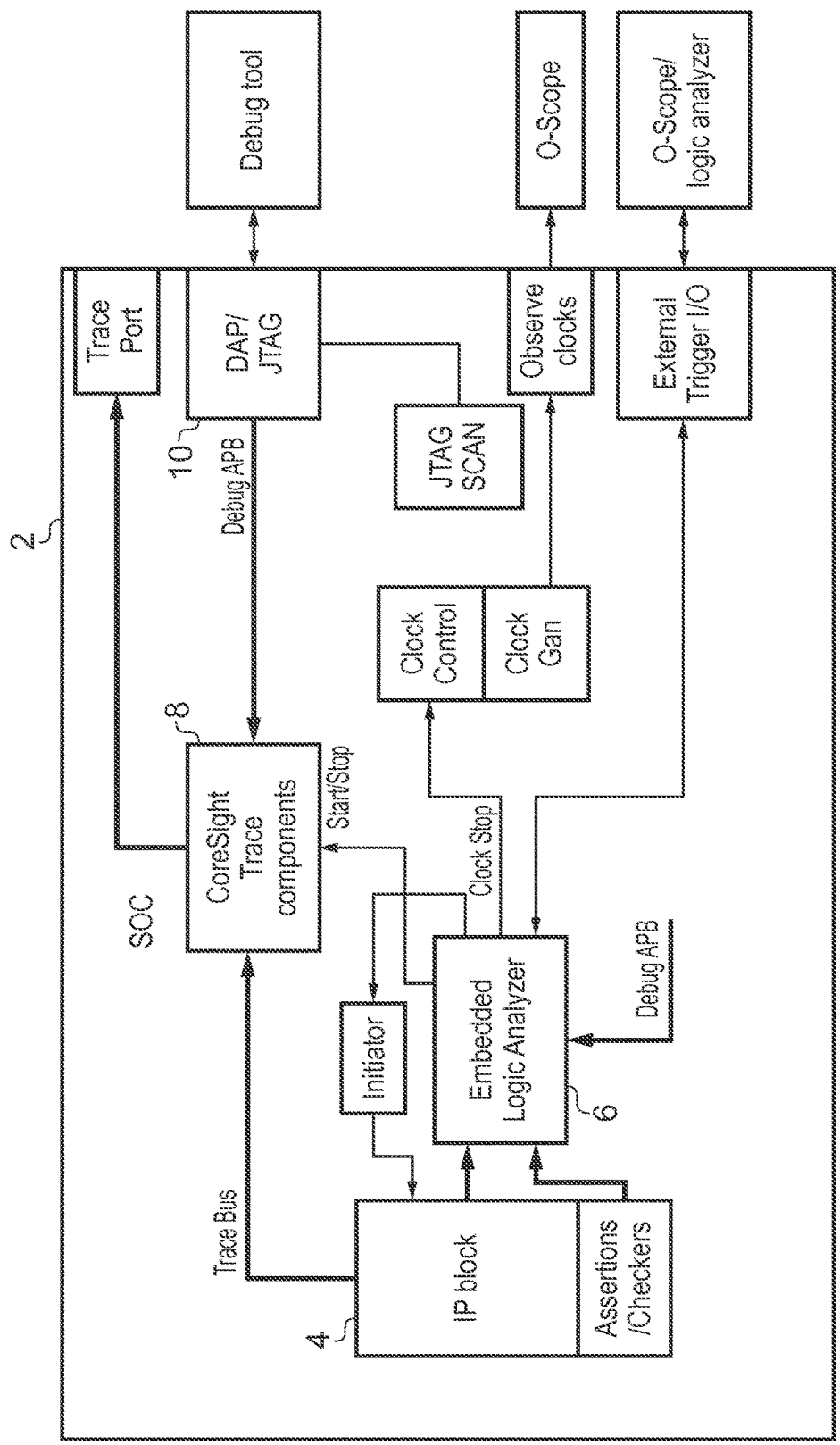

| | | | |
|---|---|---|---|
| 8,332,697 B1* | 12/2012 | Peattie | G01R 31/3177 714/724 |
| 2008/0052561 A1* | 2/2008 | Hopkins | H04L 43/18 714/39 |
| 2009/0237110 A1 | 9/2009 | Lunzer et al. | |
| 2009/0249122 A1* | 10/2009 | Nadehara | G06F 11/3648 714/34 |
| 2013/0097462 A1 | 4/2013 | Singh et al. | |

OTHER PUBLICATIONS

Daoud, E.F.A., "On-Chip Debug Architectures for Improving Observability During Post-Silicon Validation (Ehab)", Doctor of Philosophy, (2008), 154 pages.

"Design Debugging Using the SignalTap II Logic Analyzer", ALTERA, Chapter 13, Quartus II Handbook Version 13.1, vol. 3: Verification, (Nov. 2013), 70 pages.

\* cited by examiner

LOGIC ANALYZER

CROSS-REFERENCE

This application claims priority to GB Application No. 1409965.9, filed 5 Jun. 2014, the entire content of which is incorporated herein by reference.

BACKGROUND

This invention relates to the field of logic analyzers. More particularly, this invention relates to logic analyzers that are switched between a plurality of trigger states forming a sequence of trigger states.

It is known to provide logic analyzers which switch between a plurality of trigger states, each trigger state corresponding to a state in which one or more hardware signals of the hardware circuitry under test are matched against predetermined values to identify predetermined conditions/states of the hardware circuitry. A problem which arises is that as the number of trigger states increases there is a significant increase in the control overhead associated with providing the ability to flexibly move between different combinations of trigger states as may be required to perform logic analysis operations. Logic analyzers are typically provided for the purposes of debugging hardware circuitry and accordingly it is desirable that they have a high degree of flexibility in the trigger states they support and their ability to examine and match hardware signals. Providing support for such a high degree of flexibility increases the overhead associated with the logic analyzer, both in terms of circuit area and power consumption. As the logic analyzer is primarily aimed for use during debugging, and not during functional operation, it is desirable that the overhead associated with the logic analyzer be kept low.

SUMMARY

Viewed from one aspect the present techniques provide a logic analyzer for analyzing operation of hardware circuitry, said logic analyzer comprising:

a state controller configured to switch said logic analyzer between a plurality of trigger states forming a programmable sequence of trigger states and to generate an index signal for each of said plurality of trigger states;

analyzer circuitry configured to switch between said plurality of trigger states under control of said state controller and to operate within each trigger state to perform a detection of whether said hardware circuitry has hardware signal values matching target signal values for said each trigger state whereupon a switch is made to a next trigger state within said sequence of trigger states; wherein said state controller is configured to store programmable trigger state data specifying said sequence of trigger states and a value of said index signal to be generated in each trigger state; and said analyzer circuitry is configured to store programmable target control signal data controlling respective said target signal values used for each of said sequence trigger states and to use said index signal from said state controller to index into said programmable target control signal data and to select therefrom a portion of said programmable target control signal data to be used for a given trigger state.

Viewed from another aspect the present techniques provides a logic analyzer for analyzing operation of hardware circuitry, said logic analyzer comprising:

state controller means for switching said logic analyzer between a plurality of trigger states forming a programmable sequence of trigger states and for generating an index signal for each of said plurality of trigger states;

analyzer means for switching between said plurality of trigger states under control of said state controller means and for operating within each trigger state to perform a detection of whether said hardware circuitry has hardware signal values matching target signal values for said each trigger state whereupon a switch is made to a next trigger state within said sequence of trigger states; wherein said state controller means operates to store programmable trigger state data specifying said sequence of trigger states and a value of said index signal to be generated in each trigger state; and said analyzer circuitry operates to store programmable target control signal data controlling respective said target signal values used for each of said sequence trigger states and to use said index signal from said state controller to index into said programmable target control signal data and to select therefrom a portion of said programmable target control signal data to be used for a given trigger state.

Viewed from a further aspect the present techniques provides a method of operating a logic analyzer for analyzing operation of hardware circuitry, said method comprising the steps of:

switching said logic analyzer using a state controller between a plurality of trigger states forming a programmable sequence of trigger states and for generating an index signal for each of said plurality of trigger states;

switching analyzer circuitry between said plurality of trigger states under control of said state controller and operating within each trigger state to perform a detection of whether said hardware circuitry has hardware signal values matching target signal values for said each trigger state whereupon a switch is made to a next trigger state within said sequence of trigger states;

storing programmable trigger state data specifying said sequence of trigger states and a value of said index signal to be generated in each trigger state; and storing programmable target control signal data controlling respective said target signal values used for each of said sequence trigger states and using said index signal from said state controller to index into said programmable target control signal data and to select therefrom a portion of said programmable target control signal data to be used for a given trigger state.

The above, and other objects, features and advantages of this disclosure will be apparent from the following detailed description of illustrative embodiments which is to be read in connection with the accompanying drawings.

DRAWINGS

Figure 2:
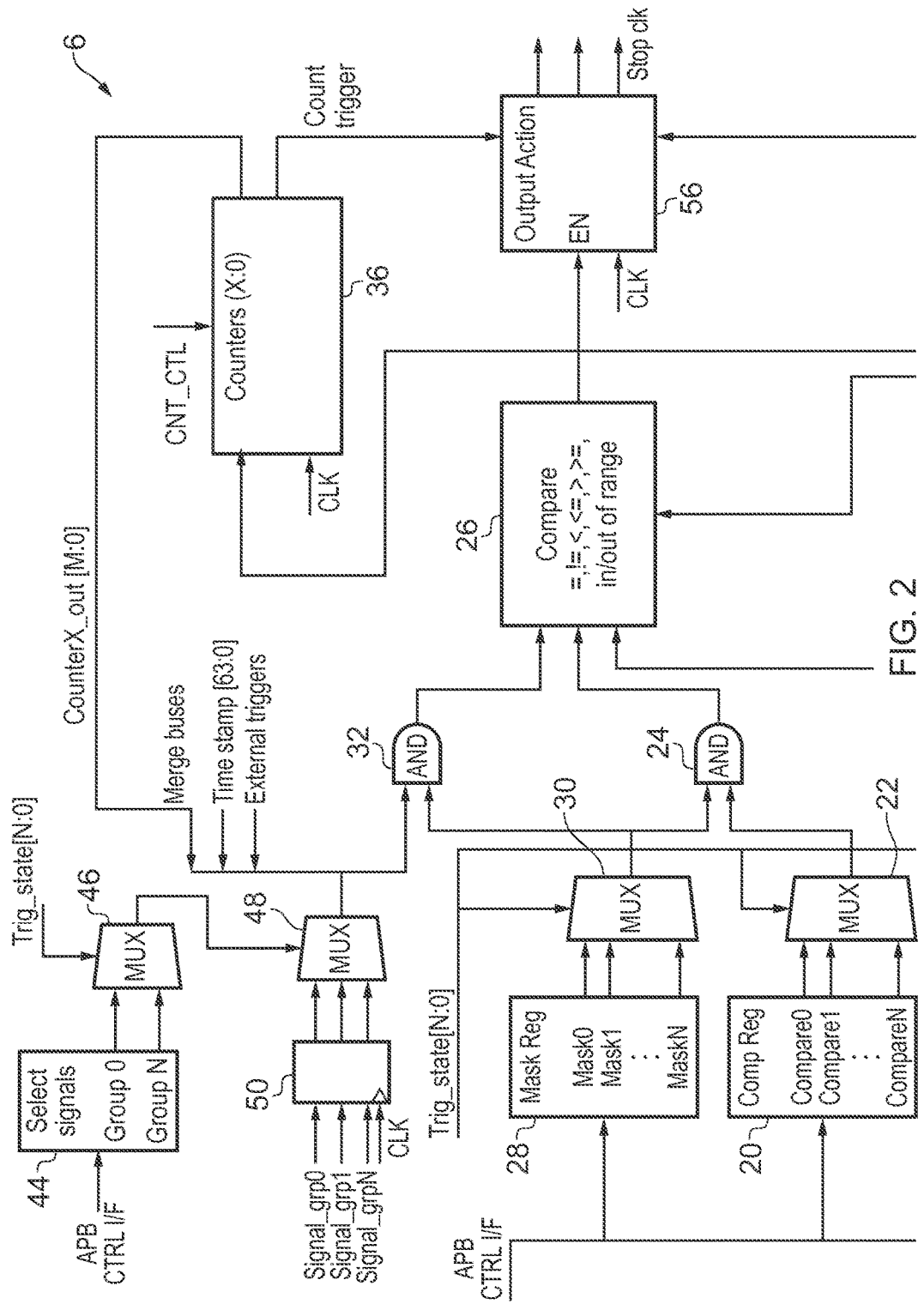
Figure 2:
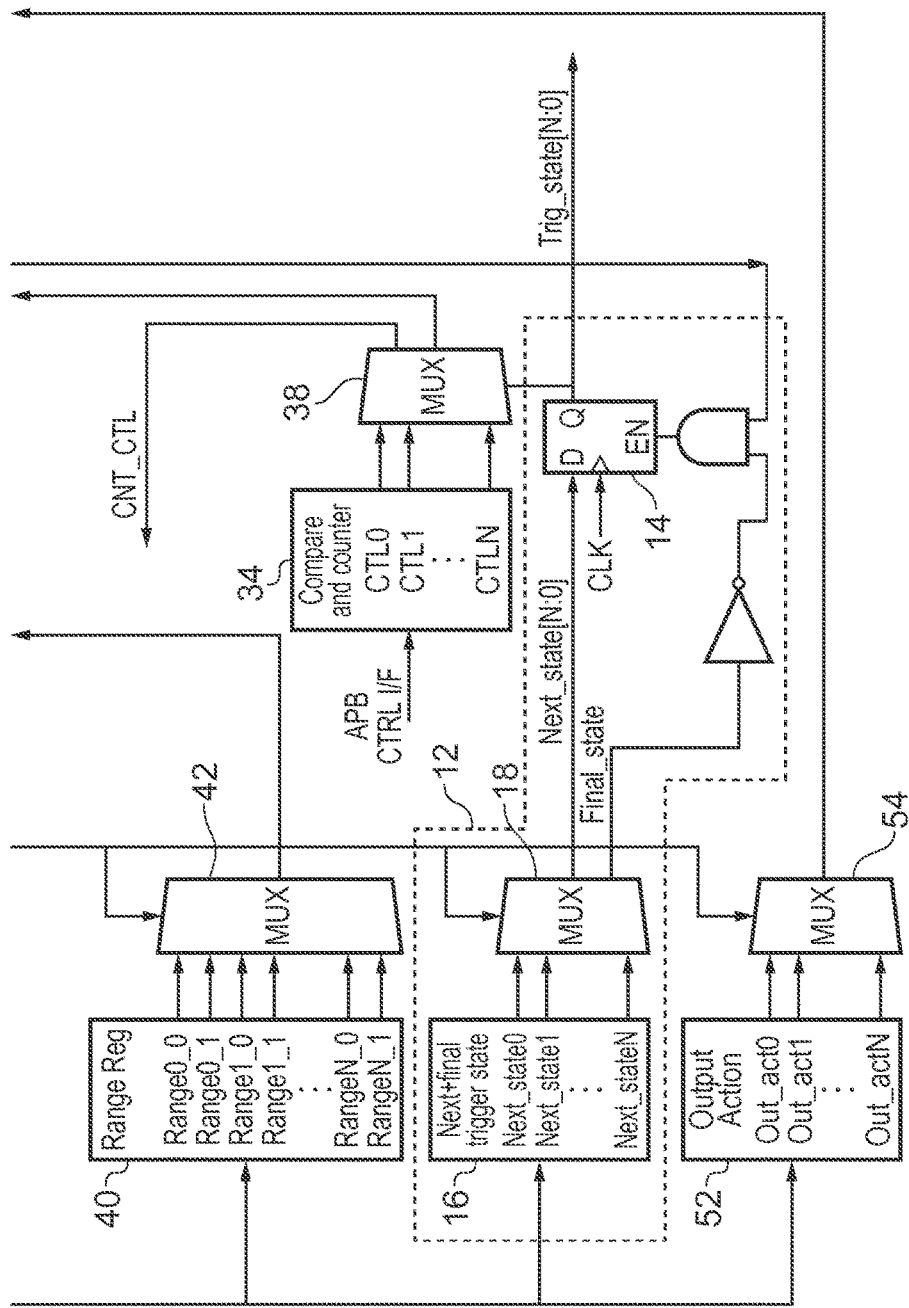

FIG. 1 schematically illustrates an integrated circuit including an embedded logic analyzer as well as other analysis/debug circuitry;

FIG. 2 schematically illustrates a logic analyzer; and

Figure 3:
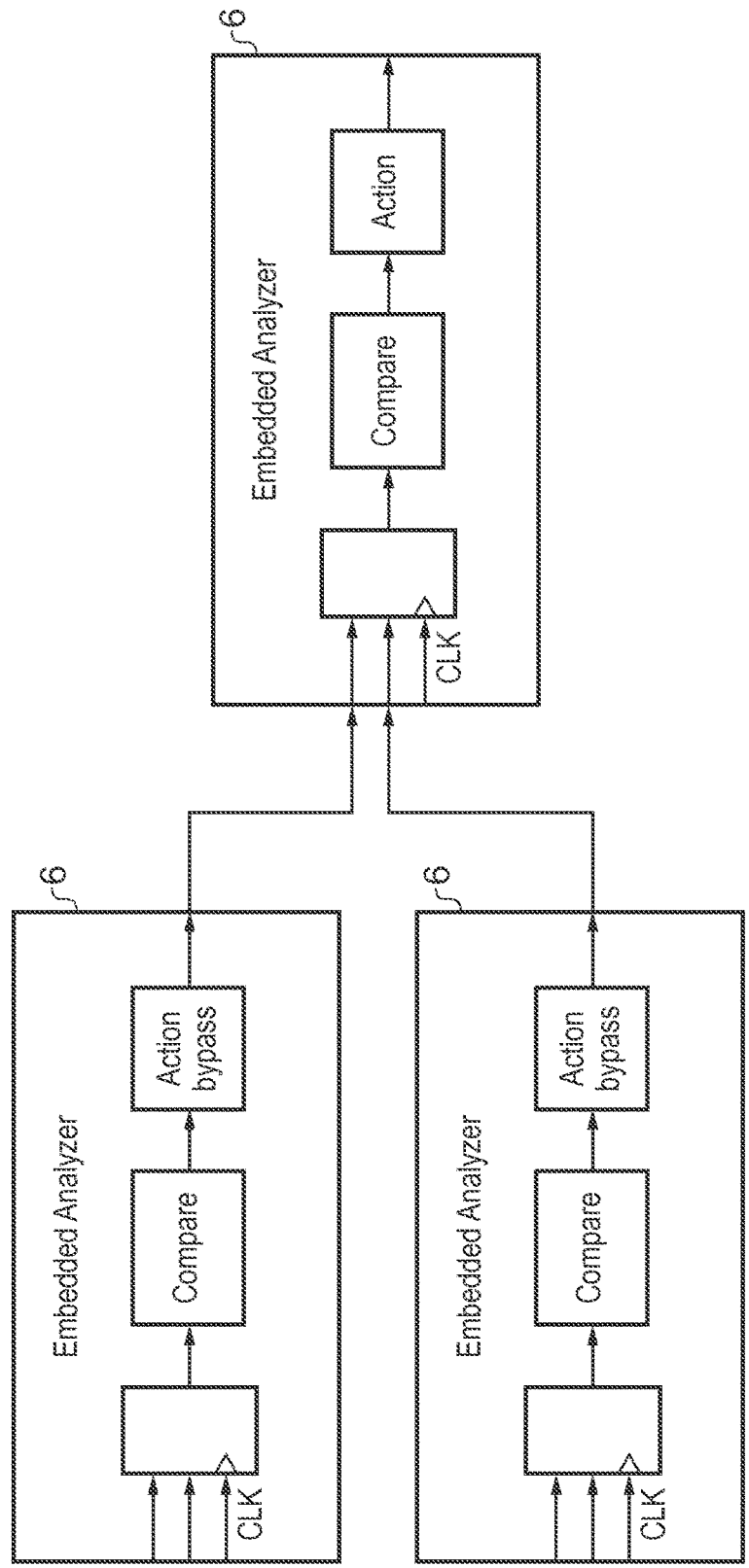

FIG. 3 schematically illustrates an arrangement of cascaded logic analyzers.

EMBODIMENTS

FIG. 1 schematically illustrates an integrated circuit 2 including hardware circuitry 4 which it is desired to subject to analysis/debug/test operations. A logic analyzer 6 is coupled to the hardware circuitry 4 and performs analysis operations on the hardware circuitry 4. The integrated circuit 2 also includes other debug and analysis circuitry, such as trace circuitry 8 and scan cell circuitry 10.

FIG. 2 schematically illustrates the logic analyzer 6 in more detail. The logic analyzer 6 includes a state controller comprising the circuitry 12 within the dashed line shown in FIG. 2. The remainder of the circuitry outside of the dashed line in FIG. 2 serves as analyzer circuitry.

The state controller 12 serves to switch the logic analyzer between a plurality of trigger states forming a programmable sequence of trigger states and also generates an index signal Trig_state[N:0], where N is the scalable number of trigger states. The value of the index signal varies depending upon the current trigger state in which the logic analyzer 6 has adopted. The state controller 12 includes a state control latch 14, a plurality of state control registers 16 and a state control multiplexer 18. The state control registers 16 store values indicating a next trigger state to be adopted. This can be in the form of an index value corresponding to that next trigger state. The state control multiplexer 18 is switched by the current index value and directs the selected next index value (trigger state value) to the input of the state control latch 14. When the state control latch 14 is clocked, then this next index value is stored into the state control latch 14. The output from the state control latch 14 forms the index value which is distributed around the logic analyzer 6 and controls the analyzer circuitry so as to configure its operation when performing a detection of whether the hardware circuitry 4 has hardware signal values matching a current set of target signal values for which the analyzer circuitry is seeking a match.

The state control registers 16 stores the programmable trigger state data which is composed of the trigger state values which define the programmable sequence of trigger states between which the logic analyzer moves as it performs its analysis operations.

The analyzer circuitry is formed of a plurality of target control signal selecting units each comprising a plurality of target control signal registers storing a plurality of target control signal values forming at least part of the programmable target control signal data together with a target control signal multiplexer, which is switched by the index value generated by the state controller 12 to select one of the target control signal values for use by the analyzer circuitry during the particular current trigger state of the logic analyzer 6. A variety of different forms of the plurality of target control signals selecting units are described below.

One form of target control signals selecting unit is a compare signal selecting unit comprising a plurality of compare signal selecting registers 20 each storing a compare signal value to be matched with hardware signal values from the hardware circuitry 4. The compare signal selecting unit further comprises a compare signal multiplexer 22 switched by the index value. The currently selected compare signal value for the current trigger state is supplied via an AND unit 24 to a comparison circuit 26 where a selected comparison operation is performed against hardware signals from the hardware circuitry 4 under test. The comparison operation performed may be one of, for example, equal to, not equal to, less than, less than or equal to, greater than, greater than or equal to, or in/out of range.

Another form of target control signal selecting unit is a mask signal selecting unit comprising a plurality of mask signal selecting registers 28 and a mask signal selecting multiplexer 30 switched by the index value. The output from the mask signal selecting multiplexer 30 is supplied as a mask value to the AND unit 24 to be applied during the current trigger state as mentioned above. The mask signal is also supplied to a further AND unit 32 where a mask operation may be performed upon the currently selected group of hardware signal values from the hardware circuitry 4 against which a comparison is currently being made by the logic analyzer 6.

A further form of target control signal selecting unit is a compare operation selecting unit. In the example embodiment of FIG. 1, the compare operation selecting unit is merged with a counter control unit and is provided in the form of a plurality of registers 34 which serve to store both compare operation selecting values for controlling the comparison operation to be applied by the comparison unit 26 as well as counter control values to be applied to a counter 36. A multiplexer 38 controlled by the current index signal serves to select the compare operation selecting value and the counter control value for the current trigger state.

In this example embodiment, the target control signal selecting unit also include a range selecting unit formed of a plurality of registers storing range specifying values 40 together with an associated multiplexer 42, which is switched by the current index value.

The one or more target control signal selecting units also include a signal group selecting unit comprising a plurality of registers 44 storing signal group selecting values together with a signal group selecting multiplexer 46 switched by the current index value. The output from the signal group selecting multiplexer 46 is supplied to a further multiplexer 48 where it selects one of the signal groups of hardware signal values collected from the hardware circuitry 4 and latched within a hardware signal latch 50. The selected group of signals are passed by the further AND unit 32 to the comparison unit 36 where they are masked and then compared against the compare values as previously discussed.

The counter 36 may be configured to perform a variety of different count operations, such as counting clock signal cycles, or counting comparisons from the comparison circuitry 26, under control of the counter control value supplied from the plurality of registers 34 via multiplexer 38 as a CNT_CTL signal. The counter 36 may be used to provide a watchdog timer by counting clock signals and comparing this count of clock signals with a compare value selected for the watchdog trigger state from one of the registers 20 storing the target count compare values and supplied via the compare value multiplexer 22 and the AND unit 24 to the compare unit 26, which compares with the count CounterX_out[M:0] from the counter 36 using the AND unit 32.

The logic analyzer 6 further includes an output action unit comprising a plurality of output action control signal registers 52 and an output action control signal multiplexer 54. The output action control signal registers 52 provide programmable output action control signal data which is selected in dependence upon the index value for the current trigger state and supplied to an output action performing unit 56, where a specified output action, such as stopping the clock signal, triggering a trace operation start or stop, starting a scan chain operation, or another operation, may be performed. The output action signal from the output action performing unit 56 can be delayed by counters contained within the counter 36 using a Count trigger signal in accordance with the above discussed operation of the counter 36.

The various forms of programmable data used to configure the operation of the logic analyzer 6, such as the programmable trigger state data and the programmable target control signal data of its various forms, together with the programmable output control signal data may be supplied and programmed via a control interface using the signal lines APB CTRL I/F as indicated in FIG. 2.

FIG. 3 schematically illustrates how a plurality of logic analyzers 6 may be located within a common integrated circuit and arranged in a cascaded form to watch for complicated hardware signal combinations and multiple trigger desired actions. The flexibility and scalability of the logic analyzer 6 facilitates such a modular arrangement.

The present techniques recognises that the use of a state controller moving between trigger states each with an associated index signal value permits that index signal value to be used to index into a programmable target control signal data which can configure the analyzer circuitry to perform desired signal matching. This facilitates a programmable and flexible logic analyser design.

In some embodiments the state controller may include a state control latch, a state control multiplexer and a plurality of state control registers to use the index value generated to also control the movement between different trigger states.

The analyzer circuitry may include one or more target control signal selecting units which each comprise a plurality of target control signal registers and a target control signal multiplexer switched by the index value to select one of the values from the target control signal registers for use by the analyzer circuitry. This arrangement permits flexibility in programming the analyzer circuitry as well as ready scalability of the logic analyzer design.

It will be appreciated that the target control signal selecting units could take a variety of different forms. In some embodiments the target control signal selecting units include a compare signal selecting unit for storing a plurality of compare signal values to be matched with the hardware signal values of the hardware circuitry.

In other embodiments the one or more target control signal selecting units may include a mask signal selecting unit configured to store a plurality of mask signal values as used as part of a masking operation during the matching of the hardware signal values with the target signal values.

A further example of a type of target control signal selecting unit which may be utilised is a compare operation selecting unit which stores a plurality of compare operation specifying values to be used to specify a compare operation to be performed when matching a given compare signal value with the hardware signal values from the hardware circuitry under test. The compare operations may, for example, include operations such as equal to, not equal to, less than, less than or equal to, greater than, or greater than or equal to.

A further possibility for one of the target control signal selecting units is a signal group selecting unit storing a plurality of signal group specifying values which each specify a group of signal values within the hardware circuitry which are to be used as the hardware signal values against which a comparison is made.

The logic analyzer may in some embodiments include one or more counters configured to perform count operations associated with given trigger states. In this context, the one or more target control signal selecting units may include a counter control unit for storing a plurality of counter control values used to control the counters during a respective trigger state.

In some embodiments a particular output action may be triggered upon a match detected by the analyzer, or a match not being detected by the analyzer. Within such embodiments, an output action unit may be provided comprising a plurality of output action control signal registers storing a plurality of output action control signal values forming at least part of programmable output action control signal data. An output action control signal multiplexer may be switched by the index value associated with the trigger states to select one of the plurality of output action control signal values for use by the logic analyzer during that trigger state.

Some embodiments may provide a control signal interface via which one or more of the programmable trigger state data, the programmable target control signal data and the programmable output action control signal data may be written and/or read.

While it is possible for the logic analyzer to be used in isolation, or provided as a separate integrated circuit, the logic analyser has particular applicability when the logic analyzer and the hardware circuitry are formed together as part of a common integrated circuit (or multiple logic analyzers are formed together with the hardware circuitry as part of a common integrated circuit).

Although illustrative embodiments have been described in detail herein with reference to the accompanying drawings, it is to be understood that the claims are not limited to those precise embodiments, and that various changes, additions and modifications can be effected therein by one skilled in the art without departing from the scope and spirit of the appended claims. For example, various combinations of the features of the dependent claims could be made with the features of the independent claims.

I claim:

1. A logic analyzer for analyzing operation of hardware circuitry, said logic analyzer comprising:
    a state controller configured to switch said logic analyzer between a plurality of trigger states forming a programmable sequence of trigger states and to generate an index signal for each of said plurality of trigger states;
    analyzer circuitry configured to switch between said plurality of trigger states under control of said state controller and to operate within each trigger state to perform a detection of whether said hardware circuitry has hardware signal values matching target signal values for said each trigger state whereupon a switch is made to a next trigger state within said sequence of trigger states; wherein
    said state controller is configured to store programmable trigger state data specifying said sequence of trigger states and a value of said index signal to be generated in each trigger state; and
    said analyzer circuitry is configured to store programmable target control signal data controlling respective said target signal values used for each of said sequence trigger states and to use said index signal from said state controller to index into said programmable target control signal data and to select therefrom a portion of said programmable target control signal data to be used for a given trigger state;
    wherein said state controller comprises a state control latch configured to store and to output said index value, a plurality of state control registers storing a plurality trigger state values forming at least part of said programmable trigger state data and a state control multiplexer switched by said current index value to select one of said plurality of state control registers as storing a next trigger state value to be stored within said state control latch when said switch to said next trigger state is made.

2. A logic analyzer as claimed in claim 1, wherein said analyzer circuitry comprises one or more target control signal selecting units comprising a plurality of target control signal registers configured to store a plurality of target control signal values forming at least part of said programmable target control signal data and a target control signal multiplexer configured to be switched by said index value to select one of said plurality of target control signal values for use by said analyzer circuitry in said detection.

3. A logic analyzer as claimed in claim 2, wherein one of said one or more target control signal selecting units comprises a compare signal selecting unit configured to store a plurality of compare signal values to be matched with said hardware signal values.

4. A logic analyzer as claimed in claim 3, wherein one of said one or more target control signal selecting units comprises a compare operation selecting unit configured to store a plurality of compare operation specifying values to be used to specify a compare operation to be performed when matching a given compare signal value with said hardware signal values.

5. A logic analyzer as claimed in claim 3, comprising one or more counters configured to perform a count operation and wherein a compare signal value is matched with said count value in one or more of said plurality of trigger states.

6. A logic analyzer as claimed in claim 5, wherein said counter is configured to count clock signal cycles and a match between said compare signal value and said count value triggers a switch to a next trigger state as part of providing a watchdog timer.

7. A logic analyzer as claimed in claim 2, wherein one of said one or more target control signal selecting units comprises a mask signal selecting unit configured to store a plurality of mask signal values to be used as part of a masking operation during said matching of said hardware signal values with said target signal values.

8. A logic analyzer as claimed in claim 2, wherein one of said one or more target control signal selecting units comprises a signal group selecting unit configured to store a plurality of signal group specifying values to be used to specify a group of signal values within said hardware circuitry to be used as said hardware signal values.

9. A logic analyzer as claimed in claim 2, comprising one or more counters configured to perform a count operation associated with a trigger state and wherein one of said one or more target control signal selecting units comprises a counter control unit configured to store a plurality of counter control values to be used to control said one or more counters during respective trigger states.

10. A logic analyzer as claimed in claim 1, comprising an output action unit comprising a plurality of output action control signal registers configured to store a plurality of output action control signal values forming at least part of programmable output action control signal data and an output action control signal multiplexer configured to be switched by said index value to select one of said plurality of output action control signal values for use by said logic analyzer during said given trigger state.

11. A logic analyzer as claimed in claim 10, comprising a control interface and said programmable output action control signal data is programmable via said control interface.

12. A logic analyzer as claimed in claim 1, comprising a control interface and said programmable trigger state data is programmable via said control interface.

13. A logic analyzer as claimed in claim 1, comprising a control interface and said programmable target control signal data is programmable via said control interface.

14. A logic analyzer as claimed in claim 1, wherein said logic analyzer and said hardware circuitry are formed together as part of a common integrated circuit.

15. A logic analyzer as claimed in claim 14, wherein said logic analyzer is one of a plurality of logic analyzers formed together as part of said common integrated circuit.

16. A logic analyzer for analyzing operation of hardware circuitry, said logic analyzer comprising:
state controller means for switching said logic analyzer between a plurality of trigger states forming a programmable sequence of trigger states and for generating an index signal for each of said plurality of trigger states;
analyzer means for switching between said plurality of trigger states under control of said state controller means and for operating within each trigger state to perform a detection of whether said hardware circuitry has hardware signal values matching target signal values for said each trigger state whereupon a switch is made to a next trigger state within said sequence of trigger states; wherein
said state controller means operates to store programmable trigger state data specifying said sequence of trigger states and a value of said index signal to be generated in each trigger state; and
said analyzer circuitry operates to store programmable target control signal data controlling respective said target signal values used for each of said sequence trigger states and to use said index signal from said state controller to index into said programmable target control signal data and to select therefrom a portion of said programmable target control signal data to be used for a given trigger state;
wherein said state controller means comprises a state control latch means operable to store and to output said index value, a plurality of state control register means storing a plurality trigger state values forming at least part of said programmable trigger state data and a state control multiplexer means switched by said current index value to select one of said plurality of state control register means as storing a next trigger state value to be stored within said state control latch means when said switch to said next trigger state is made.

17. A method of operating a logic analyzer for analyzing operation of hardware circuitry, said method comprising the steps of:
switching said logic analyzer using a state controller between a plurality of trigger states forming a programmable sequence of trigger states and for generating an index signal for each of said plurality of trigger states;
switching analyzer circuitry between said plurality of trigger states under control of said state controller and operating within each trigger state to perform a detection of whether said hardware circuitry has hardware signal values matching target signal values for said each trigger state whereupon a switch is made to a next trigger state within said sequence of trigger states;
storing programmable trigger state data specifying said sequence of trigger states and a value of said index signal to be generated in each trigger state; and
storing programmable target control signal data controlling respective said target signal values used for each of said sequence trigger states;
using said index signal from said state controller to index into said programmable target control signal data and to select therefrom a portion of said programmable target control signal data to be used for a given trigger state,
wherein said step of storing programmable trigger state data includes:
storing in a state control latch said index value;
outputting said index value from said state control latch;

storing a plurality trigger state values forming at least part of said programmable trigger state data in a plurality of state control registers; and switching a state control multiplexer by said current index value to select one of said plurality of state control registers as storing a next trigger state value to be stored within said state control latch when said switch to said next trigger state is made.

* * * * *